US006548997B1

(12) United States Patent
Bronfer et al.

(10) Patent No.: US 6,548,997 B1
(45) Date of Patent: Apr. 15, 2003

(54) MECHANISM FOR MEASUREMENT OF TIME DURATION BETWEEN ASYNCHRONOUS EVENTS

(75) Inventors: Alexander Bronfer, Ramat Gan (IL); Eldad Falik, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 09/923,234

(22) Filed: Aug. 3, 2001

(51) Int. Cl.[7] .............................. G06F 1/12; G06F 1/14; G04C 11/00; G01R 29/26

(52) U.S. Cl. ......................... 324/76.48; 702/69; 702/79; 368/47; 368/52; 713/400; 713/502

(58) Field of Search .............................. 324/76.48, 532, 324/535; 702/69, 79; 713/500, 503, 400, 502; 368/89, 113

(56) References Cited

U.S. PATENT DOCUMENTS 4,764,694 A 8/1988 Winroth
5,467,464 A 11/1995 Oprescu et al.
5,925,136 A 7/1999 Watts, Jr.
6,061,305 A 5/2000 Williams

*Primary Examiner*—N. Le
*Assistant Examiner*—Anjan K. Deb
(74) *Attorney, Agent, or Firm*—Ronald O. Neerings; Wade J. Brady, III; Frederick J. Telecky, Jr.

(57) ABSTRACT

A novel and useful mechanism for measuring the time duration between asynchronous events. The mechanism utilizes two metastability resolvers, one for detecting the rising edge of the input signal and one for detecting its falling edge. The input signal is typically assumed to have some known nominal clock rate, but its exact frequency and phase (timing of transitions) are not known. Each of the two metastability resolvers comprises two branches of cascaded flip flops, each clocked off the rising edge and falling edge of a fast clock. Each metastability resolver functions to output an edge event signal and a clock phase signal indicating which edge of the fast clock the rising (or falling) edge of the data signal was closer to. The edge event signals are used to start and stop a counter clocked off the fast clock. The clock phase is used to correct (i.e. compensate) the counter value depending on which half cycle of the fast clock the rising and falling edge of the data signal arrived in. Thus, this measurement mechanism reduces its maximal timing error from a full cycle of the fast clock to only half of it.

26 Claims, 6 Drawing Sheets

30

MECHANISM FOR MEASUREMENT OF TIME DURATION BETWEEN ASYNCHRONOUS EVENTS

FIELD OF THE INVENTION

The present invention relates generally to timing circuits and more particularly relates to a mechanism for measuring the time duration of asynchronous events.

BACKGROUND OF THE INVENTION

Numerous applications exist that require the measurement of asynchronous events. A common example is the measurement of timing drift between two clock signals as described in the following example. Many communications systems include both active and standby modes of operation. In the active mode, transmission between the two endpoints (e.g., between a master and a slave) may occur. During the standby mode of operation, however, transmission temporarily ceases between the endpoints.

Standby modes are used to significantly reduce the power consumption of communications devices whereby all but a small portion of necessary circuitry is powered down. Standby modes of operation are used extensively in mobile communications devices, especially those powered by batteries or other limited types of power sources. At some point later in time, the device is 'awoken' and returns to the active state for a period of time before entering standby mode again.

A common requirement of communication devices is that while in standby mode the two endpoints need to remain synchronized to a certain extent, such that network timing can be quickly recovered without the need for an extended acquisition phase. Commonly, a device (i.e. typically a portable device based on battery power) switches from a fast clock rate used in the active mode to a lower rate clock while in standby mode, which enables the device to maintain network timing while significantly reducing its power consumption. Since the accuracy, or relative drift, of this slower clock determines the amount of time that the system can remain in standby without actual transmissions being exchanged, it is important to either have an accurate standby clock or to be able to compensate for clock drifts and errors.

In measuring the clock drift of multiple clock signals, the timing of asynchronous events may be required. Often, cascaded flip-flop circuits are used to capture asynchronous events. A common occurrence in these types of circuits is known as the metastability problem wherein one or more flip flops may get confused if the data at the input to the flip flop changes during the setup time interval preceding a clock pulse. The flip flop may make a decision in any case or if the input changed at exactly the wrong time during the moment of decision, such that a decision is not made and the output of the flip flop lingers around the logic threshold for a period of time (i.e. microseconds). In the worst case, the flip-flop settles in a particular state and then switches back to the other state.

Prior art mechanisms intended to reduce the probability of metastability affecting internal logic are based on buffering comprising two or more cascaded synchronized flip-flops, each sampling the output of its predecessor.

Note that in properly designed synchronous systems such problems should not occur as setup times are satisfied by using logic fast enough such that the inputs to flip flops are stable for a period of $t_{setup}$ before the next clock pulse.

Detecting and measuring asynchronous signals going from one clock domain to another, however, is problematic and may lead to metastability problems because it cannot be guaranteed that input transitions do not occur during the setup time interval.

A schematic diagram illustrating a prior art circuit for measuring the time of asynchronous events is shown in FIG. 1. The circuit, generally referenced 10, comprises two flip-flops FF1 12, FF2 14 and a counter 16. The asynchronous events are input to the circuit by the binary data signal 20. The events are represented by a low to high transition followed some time later by a high to low transition. A clock signal 18 clocks all three components. The clock rate is assumed to be higher than that of the input data signal.

In operation, the first flip-flop FF1 synchronizes the asynchronous data signal to the clock. The second flip flop FF2 acts as a buffer to prevent any metastability of the signal input to the counter. The output of FF2 enables the counter 16. After the occurrence of a high to low transition of the data signal, the count value represents the duration between the two events.

A problem in this circuit, however, is that FF1 may enter metastability since a transition of the asynchronous input data signal may occur within the setup or hold time of FF1. In this case, the output of FF1 cannot be predicted and may oscillate before settling to a random output of 0 or 1. FF2 buffers the counter from FF1 that may be in metastability. This, however, does not guarantee that the counter will be provided the correct enable signal.

A first timing diagram illustrating the inaccuracies of the prior art circuit of FIG. 1 is shown in FIG. 2. The data signal representing the asynchronous event is approximately two cycles wide and arrives asynchronously with respect to the clock. Due to FF2, the EN signal goes high after a full clock delay. The resultant count represents the length of time between events. Note, however, that the event +/− a whole clock cycle yields the same count result.

A second timing diagram illustrating the inaccuracies of the prior art circuit of FIG. 1 is shown in FIG. 3. In this example, the data signal is approximately four clock cycles wide. The resultant count output, however, is again two. Here, the resultant error may be as high as two clock cycles. Thus, the prior art circuit 10 has a resultant resolution of two clocks.

The 'Base line' is the 'calibration period' measured by the counter after averaging the ambiguity originating from FF1/FF2. The error incurred is ±½ clock cycle. The overall 'calibration period' measurement error is thus ±1 fast clock cycle.

A third timing diagram illustrating the inaccuracies of the prior art circuit of FIG. 1 is shown in FIG. 4. The clock 18 is indicated by the fast clock. The data signal, which is four fast clocks wide, is indicated by the slow signal representing the calibration period to be measured. The calibration period in terms of the fast clock is also shown. The resultant counter output is shown. The ambiguity of the slow signal is indicated as +/−½ fast clock, which at the rising and falling edge will yield the same result.

It is important to note that the probability of having a metastable condition on the second flip-flop is highly dependent on the time between the sampling instances at the first stage of the metastability circuit to the sampling at the second stage. In other words, the probability of metastability is inversely proportional to the clock period.

In the case where the sampling of the first stage does not generate a metastability state at its output, the data will be valid at the output of the second stage after the next sampling edge of the second stage. In the case where the first stage sampling does generate a metastability state at its output, there is a probability that by the time the second stage is sampled, the state of the first stage has settled into the state that existed before the sampling.

In this case the data will be valid not after the next sampling edge of the second stage, but after the second sampling edge. This results in an ambiguity as to which edge the data will be valid on at the output of the second stage. The amount of ambiguity is the time difference between the two active sampling edges of the second stage.

In many applications, such as in communication systems (e.g., wired, wireless, portable, etc.), it is desirable to recover and/or measure timing with greater accuracy. There is thus a need for a mechanism for measuring asynchronous events which provides improved accuracy and which reduces the probability of occurrence of metastability conditions in the logic circuitry.

SUMMARY OF THE INVENTION

The present invention provides a novel and useful mechanism for measuring the time duration between asynchronous events. The invention has numerous applications including, for example, measuring the relative timing drift of a clock signal. The invention provides improved accuracy with respect to prior art mechanisms and circuits, utilizing a circuit of low complexity and without requiring additional higher frequency clocking signals. The present invention is particularly suitable for incorporation in hardware-based circuits such as those used in portable computing devices such as laptop computers, cellular telephones and wireless connected PDAs.

To aid in illustrating the principles of the present invention, an example application is presented, wherein a period corresponding to the rate of the standby clock of a device is measured using a more accurate faster clock that is used during the active mode of operation of the device. The result of this measurement is used to compensate for drifts and to better time the turn-on of the device after extended standby periods, which are typically measured based on the slower clock.

However, since the two frequencies originate from different clock domains and are not synchronized, metastability could occur during the sampling process in the mechanism that uses both. In accordance therewith, the mechanism of the present invention offers a solution to this problem. The mechanism not only reduces the probability of occurrence of a metastability condition in the system, but also improves the timing accuracy which is crucial in making clock drift measurements.

The current art reduces asynchronous event measurement (e.g., clock drift measurement) timing ambiguity to only half a clock cycle while enabling a synchronous solution whereby all flip flops are clocked off the same clock.

The mechanism utilizes two metastability resolvers, one for detecting the rising edge of the input data signal and one for detecting the falling edge. Each metastability resolver comprises two branches of cascaded flip flops wherein each branch is made of one or more flip flops clocked off the rising edge of a fast clock and one or more flip flops clocked off the falling edge of the fast clock.

Each metastability resolver functions to output an edge event signal and a clock phase signal indicating which edge of the fast clock the rising (or falling) edge of the data signal was closer to. The edge event signals are used to start and stop a counter clocked off the fast clock. The clock phase is used to correct (i.e. compensate) the counter value depending on which half cycle of the fast clock the rising and falling edge of the data signal arrived in.

Benefits of the mechanism of the present invention include (1) enhanced timing resolution of metastability resolving from ±1 clock period of the prior art to ±½ clock period, which is advantageous in many portable applications with limited battery power; (2) enabling the extension of standby time in portable wireless devices based on slow standby clocks, which in most cases can be doubled with the use of the mechanism of the present invention; and (3) simple realization of circuitry to implement the invention, resulting in low cost and low current consumption; (4) does not require the use of higher clock rates (which are typically unavailable) to enhance the timing resolution of the device; and (5) use of the same fast clock to drive the circuitry thus allowing the device to remain synchronous.

There is thus provided in accordance with the present invention an apparatus for measuring the time duration between asynchronous events using a first clock comprising means for generating a first edge event signal and an associated first clock phase signal, the first edge event signal corresponding to the detection of a rising edge of an input data signal, the first clock phase signal adapted to indicate whether the rising edge of the data signal occurred in a first or second half cycle of the first clock, means for generating a second edge event signal and an associated second clock phase signal, the second edge event signal corresponding to the detection of a falling edge of the data signal, the second clock phase signal adapted to indicate whether the falling edge of the data signal occurred in a first or second half cycle of the first clock, a counter adapted to generate an N bit output wherein counting is enabled in response to the first edge event signal and wherein counting is disabled in response to the second edge event signal and means for compensating the N-bit counter output in accordance with the first clock phase signal and the second clock phase signal so as to generate an N+1 bit output representing the time duration.

There is also provided in accordance with the present invention a method of measuring the time duration between asynchronous events, the method comprising the steps of generating a first edge event signal and an associated first clock phase signal, the first edge event signal adapted to indicate a first transition of an input data signal from a low to high state, the first clock phase signal adapted to indicate whether the first transition of the data signal occurred in a first or second half cycle of a first clock signal, generating a second edge event signal and an associated second clock phase signal, the second edge event signal adapted to indicate a second transition of the input data signal from a high to low state, the second clock phase signal adapted to indicate whether the second transition of the data signal occurred in a first or second half cycle of a first clock signal, enabling an N-bit counter in response to the first edge event signal, disabling the counter in response to the second edge event signal and compensating the N-bit counter output in accordance with the first clock phase signal and the second clock phase signal so as to generate an N+1 bit output representing the time duration.

There is further provided in accordance with the present invention an apparatus for measuring the relative timing drift between a first clock and a slower second clock comprising means for generating a first edge event signal and an associated first clock phase signal, the first edge event signal adapted to indicate a first transition of the second clock from a low to high state, the first clock phase signal adapted to indicate whether the first transition of the second clock occurred in a first or second half cycle of the first clock, means for generating a second edge event signal and an associated second clock phase signal, the second edge event signal adapted to indicate a second transition of the second clock from a high to low state, the second clock phase signal adapted to indicate whether the second transition of the second clock occurred in a first or second half cycle of the first clock, a counter adapted to generate an N bit output wherein counting is enabled in response to the first edge event signal and wherein counting is disabled in response to the second edge event signal and means for correcting the N-bit counter output in accordance with the first clock phase signal and the second clock phase signal so as to generate an N+1 bit output representing the time duration.

There is also provided in accordance with the present invention an apparatus for measuring the relative timing drift between a first clock and a slower second clock comprising a first metastability resolver clocked by the first clock for generating a first edge event signal and an associated first clock phase signal, the first edge event signal corresponding to the detection of a rising edge of the second clock, the first clock phase signal adapted to indicate whether the rising edge of the second clock occurred in a first or second half cycle of the first clock, a second metastability resolver clocked by an inverted first clock for generating a second edge event signal and an associated second clock phase signal, the second edge event signal corresponding to the detection of a falling edge of the second clock, the second clock phase signal adapted to indicate whether the falling edge of the second clock occurred in a first or second half cycle of the first clock, a counter adapted to generate an N-bit output wherein counting is enabled in response to the first edge event signal and wherein counting is disabled in response to the second edge event signal, a correction circuit adapted to generate a correction factor in accordance with the first clock phase signal and the second clock phase signal and an adder adapted to add a least significant bit to the counter output to yield an N+1 bit value and to generate the sum of the correction factor and the N+1 bit value to yield the relative timing drift between the first clock and the second clock.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout
The following notation is used throughout this document.

| Term | Definition |
|---|---|
| ASIC | Application Specific Integrated Circuit |
| CNT | Count |
| DIS | Disable |
| EN | Enable |
| FF | Flip Flop |
| FPGA | Field Programmable Gate Array |
| LSB | Least Significant Bit |
| LUT | Lookup Table |
| PDA | Personal Digital Assistant |
| RAM | Random Access Memory |
| ROM | Read Only Memory |
| RST | Reset |

DETAILED DESCRIPTION OF THE INVENTION

The present invention provides a mechanism for measuring the time between asynchronous events. The invention can be used in numerous applications including, for example, in measuring the relative timing drift of a clock signal. The invention provides improved accuracy with respect to prior art mechanisms and circuits. The present invention is particularly suitable for incorporation in hardware-based circuits such as those used in portable computing devices such as laptop computers, cellular telephones and wirelessly connected PDAs.

Figure 5:
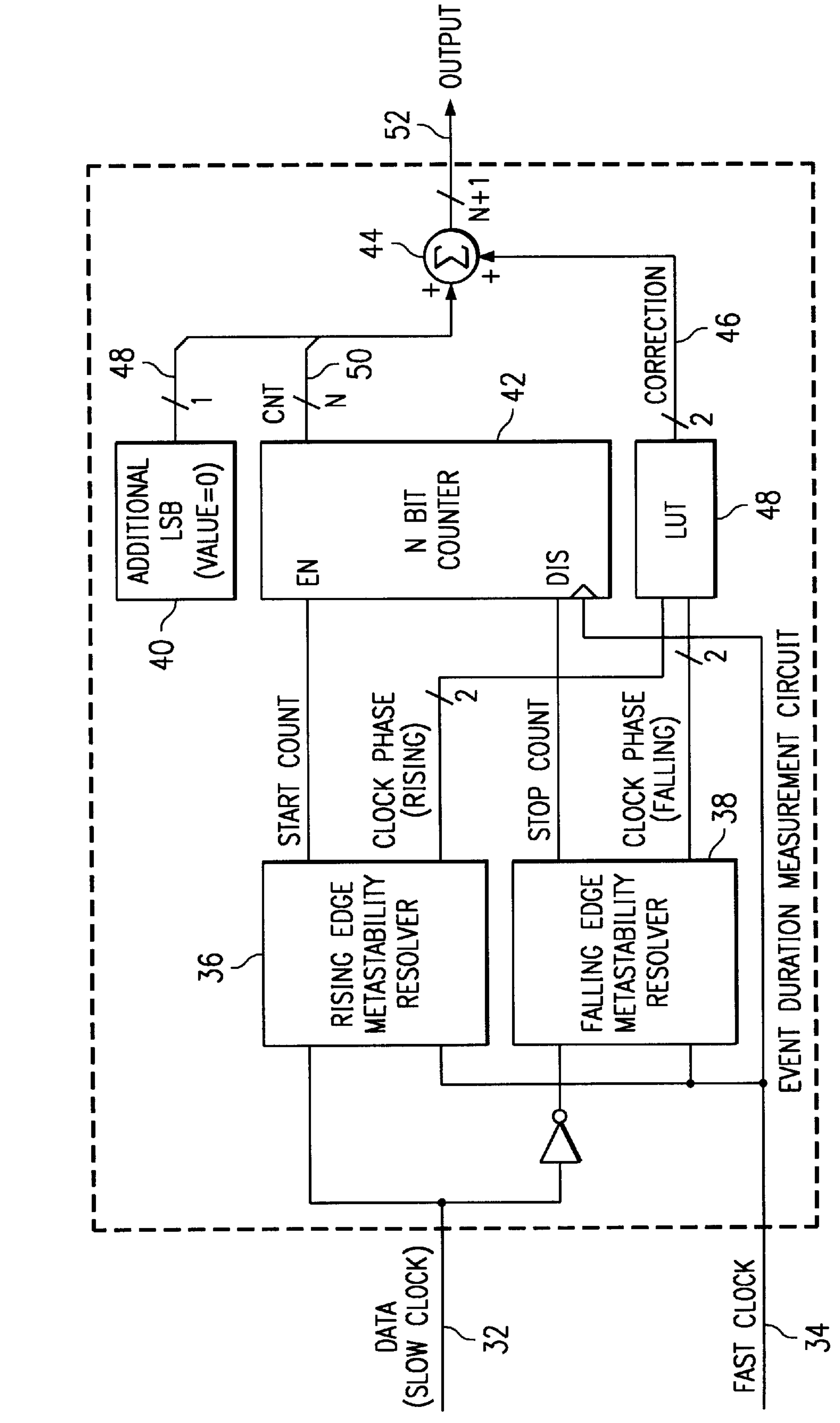
FIG. 5 is a block diagram illustrating an example embodiment of the event duration measurement circuit of the present invention.

A block diagram illustrating an example embodiment of the event duration measurement circuit of the present invention is shown in FIG. 5. The event duration measurement circuit, generally referenced 30, comprises a first stage metastability resolver comprising two components: a rising edge metastability resolver 36 adapted to detect the rising edge of the input data signal 32 and a falling edge metastability resolver 38 adapted to detect the falling edge of the input data signal. The circuit 30 also comprises an N-bit counter 42, additional LSB 40, correction circuit 48 and summer 44.

To aid in illustrating the principles of the present invention, the example provided illustrates the measurement of the relative timing drift of a slow clock using a fast clock signal. The fast clock is used during active operation of a device incorporating the circuit while the slow clock is used when the device is placed in standby mode wherein power consumption is greatly reduced. In the system of the present invention, the period corresponding to the rate of the standby clock of the device (e.g., 375 kHz), is measured using the higher, more accurate independent fast clock (e.g., 12 MHz) which is used during active operation of the device. The result of this measurement is used to compensate for drifts and to better time the turn-on of the device after extended standby periods, the measurement of which are based on the slower clock.

Since the two frequencies (i.e. the slow clock and fast clock) originate from different clock domains and are not synchronized, metastability could occur during the sampling process in the mechanism that uses both to determine the timing drift of the slow clock. The mechanism of the present invention provides a solution to this problem which not only greatly reduces the probability of metastability occurring in the system but also improves the timing accuracy which is crucial in this particular application of drift measurement.

Metastability exists in every logic system where a signal of a first clock domain is input into another circuit which operates in a second clock domain different than that of the first wherein the second clock domain is not synchronized with the first clock domain. The circuit 30 reduces the probability of metastability affecting internal logic based on buffering using two or more cascaded synchronized flip-flops, each sampling the output of its predecessor. The output of the rising edge metastability resolver 36 comprises a start count signal and a clock phase signal. Similarly, the output of the falling edge metastability resolver 38 comprises a stop count signal and a clock phase signal. The start count signal is used to enable the counter 42 while the stop count signal is used to disable the counter. The resultant output of the counter is input to a correction circuit comprising a correction factor generator 48 and summer 44. A circuit 40 provides an additional LSB 48 having a value of zero which is added to the output of the counter and the resultant N+1 bits are input to the summer.

The correction factor generator may be implemented using any suitable technique such as combinatorial logic, look up table, etc. The correction factor is added to the N+1 count and the resultant sum is the output representing the duration of time between the two asynchronous events (i.e. the time between the rising and falling edges of the input data signal pulse).

Figure 6:
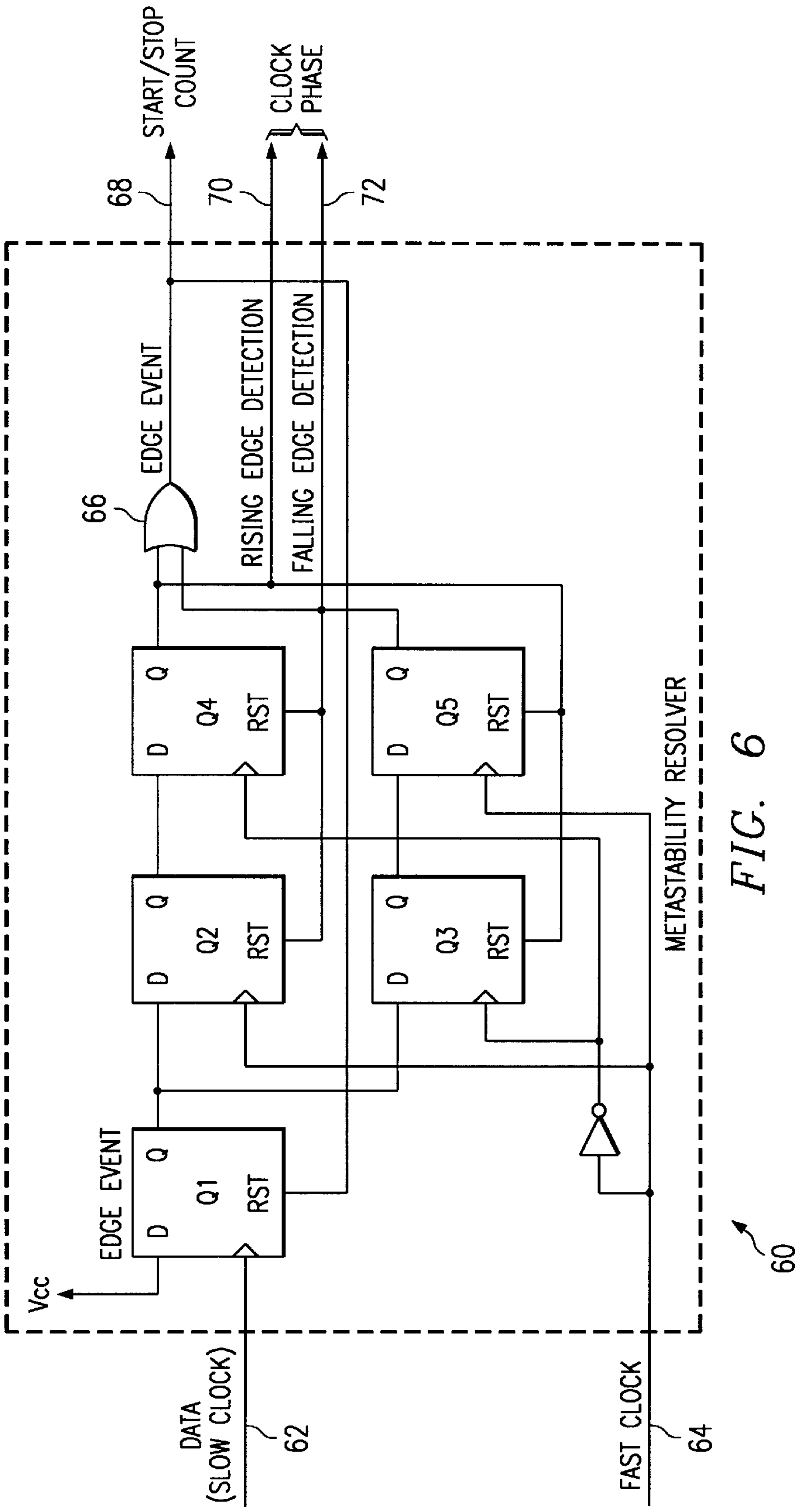
FIG. 6 is a schematic diagram illustrating an example implementation of the metastability resolver of the present invention.

The operation of each metastability resolver will now be described in more detail. A schematic diagram illustrating an example implementation of the metastability resolver of the present invention is shown in FIG. 6. The metastability resolver, generally referenced 60, comprises two braches of cascaded flip-flops. Not all the flip-flops use the same active edge of the clock. Two branches of cascaded flip-flops are used wherein each of the branches comprises one or more flip-flops that sample on the rising edge of the fast clock 64 and one or more that sample on the falling edge of the fast clock. The circuit 30 may be implemented using any suitable logic (e.g., D, J-K, R-S flip flops, etc.) but is preferably implemented using flip-flops of the same type (e.g., D-type flip flops) wherein the clock signal for some of the flip flops is inverted using a logic inverter.

In the example implementation presented herein, a total of five D-type flip-flops are used which are adapted to sample at the rising edge of their clock inputs. The input data signal 62 to be measured is input to the clock input of Q1. Note that in this example the asynchronous events to be measured are represented by the rising and falling edges of the data signal 62 which in this case comprises the slow clock signal.

Since the D input of Q1 is connected to $V_{CC}$ (i.e. a fixed '1'), the Q output will be set to '1' in response to a low to high transition (i.e. '0' to '1') in the data. Before the next low to high transition in the data signal can occur, Q1 will be cleared by the 'edge event' input to its RST (i.e. reset) input. The Q output of Q1 is fed simultaneously into two branches of cascaded flip-flops: The upper branch comprised of Q2/Q4, and the lower branch comprised of Q3/Q5. The fast clock is used to clock Q2 in the upper branch and Q5 in the lower branch while the inverted fast clock is used to clock Q4 in the upper branch and Q3 in the lower branch.

Depending on the relative timing of the rising edge in the input data and that of the fast clock signal, either Q2 or Q3 will capture the transition first. Note that Q2 samples on the rising edge of the clock while Q3 samples on the falling edges of the clock.

If the rising edge of the input data signal is closer in time to the rising edge of the fast clock signal then Q2 is set to '1' first. The next falling edge of the clock signal (which occurs within a time of half a clock period) will transfer the '1' into Q4. The output of Q4 is input to the RST inputs of Q3 and Q5 to keep them in their zero states. Thus, the output 70 of the upper branch, denoted 'rising edge detected,' indicates the arrival of the rising edge to subsequent logic circuitry. The timing accuracy of this signal is one half a clock cycle.

One the other hand, if the rising edge of the input data signal is closer in time to the falling edge of the fast clock signal then Q3 is set to '1' first. The next rising edge of the clock signal causes the '1' at the Q output of Q3 to be transferred to Q5 one half-clock cycle later. The output of Q5 is input to the RST inputs of Q2 and Q4 thus maintaining Q2 and Q4 in the zero state. In this case, the output 72 of the lower branch, denoted 'falling edge detected', indicates that a falling edge in the data signal has been detected, here too with a timing accuracy of one half a clock period of the fast clock.

The OR gate 66 produces an output signal 68 denoted 'edge event' equal to a '1' in response to either the rising or falling edge detected signals. The edge event signal is generated after a delay which could be up to one clock period in duration after the rising edge of the input data signal. The edge event signal is fed back into the RST input of Q1 to reset it for the reception of the next rising edge in the data signal.

The rising edge and falling edge detected signal make up the clock phase output. The clock phase is subsequently used to compensate for the ambiguity in the edge event signals. The clock phase signal is adapted to indicate whether the rising edge of the data signal occurred in the first or the second half cycle of the fast clock.

It is important to note that the probability of having a metastable condition on the second flip-flop (i.e. Q4 or Q5) is highly dependent on the time between the sampling instances at the first stage of the metastability resolver to the sampling at the second stage. In other words, the probability of metastability is inversely proportional to the clock period. In order to reduce this probability, the sampling of the second stage should be delayed as much as possible. In the example embodiment of the present invention this delay is reduced to one half of a fast clock cycle. In alternative embodiments, the delay may be reduced even further depending on the available clock signals.

With reference to FIG. 5, the mechanism of the present invention is based on a slow clock calibration period signal (i.e. data signal 32) driving a counter through a metastability resolver whereby the counter is clocked using the fast clock signal. Using this mechanism, the relative accuracy (i.e. timing drift) of the slow clock can be measured using the fast clock.

The use of the metastability resolver of the present invention enables the doubling of the accuracy of the measurement of any specific calibration period.

In the example circuit embodiment 30, two metastability resolvers, described hereinabove, are used to control the fast clock counter 42. Note that one skilled in the art can modify the circuit 30 to achieve similar operation using one metastability resolver with additional registers in both the slow and the fast clock domains.

The beginning of the calibration period (i.e. low to high transition in the input data signal) is propagated from the slow clock domain to the fast clock domain by the rising edge metastability resolver 36. In response to the start count signal, counting of the fast clock counter is enabled. Note, however, that there is an ambiguity of one half a fast clock cycle in exactly where the slow clock domain calibration period signal changed states. This information is provided in the rising clock phase status signal output of the rising edge metastability resolver which indicates whether the rising edge of the data signal occurred in the first or the second half cycle of the fast clock.

The falling edge metastability resolver is constructed similarly to the rising edge metastability resolver. The falling edge metastability resolver, however, is fed with the inverted slow clock domain calibration period signal (i.e. an inverted version of the input data signal), thus adapting it to detect the falling edge rather than the rising edge. The falling edge metastability resolver functions to detect the falling edge of the slow clock domain signal which stops the counting of the fast clock counter. Here too, there is an ambiguity of one half of the fast clock cycle. This ambiguity information is generated by the falling edge metastability resolver in the falling clock phase status signal which functions to indicate whether the falling edge of the data signal occurred in the first or the second half cycle of the fast clock.

After the falling edge of the data signal is received (i.e. at the end of the calibration), the output CNT 50 of the fast clock counter comprises the residue of the 'slow clock calibration period' divided by the fast clock. This value is augmented with the rising and falling clock phase information output from the rising and falling metastability resolvers which functions to enhance the resolution of the timing measurement.

In this example embodiment, the rising and falling clock phase signals comprise two bits each. These two signals are input to a correction circuit comprising a LUT 48 or other suitable correction factor generator circuit. The function of the correction circuit is to generate a correction factor 46 to compensate the count value depending on whether the rising and falling edge of the input data signal occurred in the same or different half cycles of the fast clock thus yielding four distinct possibilities.

Figure 7:
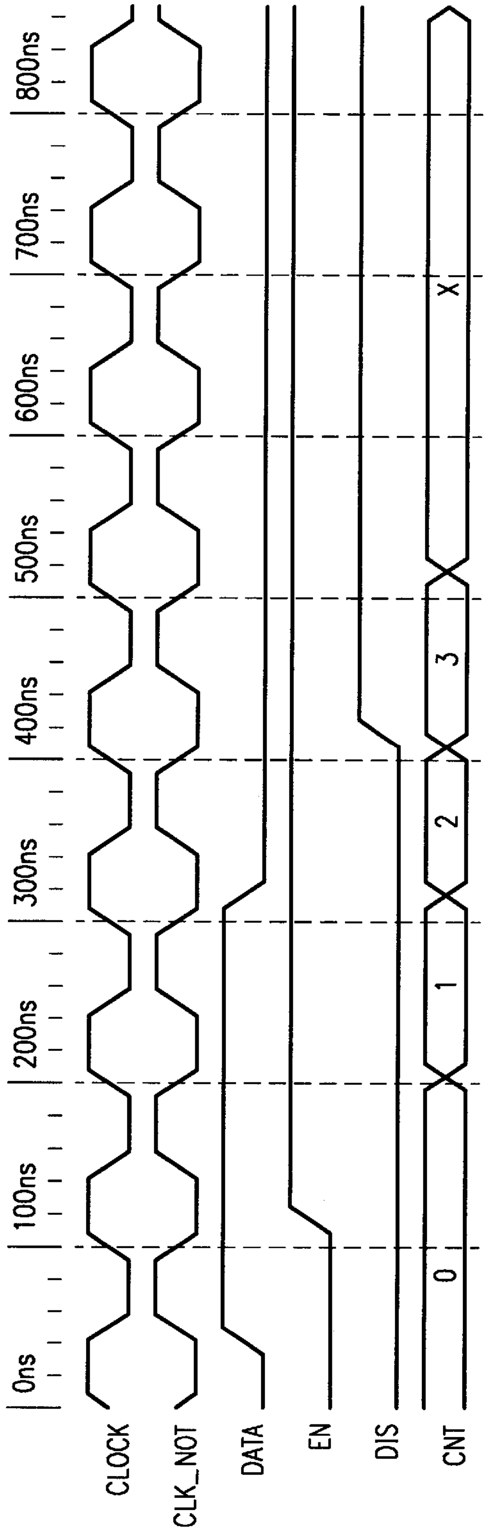
FIG. 7 is a first timing diagram illustrating the operation of the event duration measurement circuit of the present invention.

To illustrate, consider as an example, the timing diagram of FIG. 7. In this example, the rising and falling edge of the input data signal occur in the same first half of the fast clock. There exists a plurality of durations of the data pulse, measured in terms of half cycles of the fast clock, that yield the same counter output. In this case, input data signal durations of 5, 6 or 7 result in the same count. In accordance with the present invention, the average of these possible durations is taken as the overall measurement output. In this case, the value of 6 is output, or in other words, the output is 2*CNT.

This correction or compensation of the count value is performed by the correction circuit. An LSB having a value of zero is added to the N-bit counter output. A value generated by the LUT 48 is summed with the N+1 bit count value via summer 44 to generate the circuit output value 52.

The contents of the LUT are provided below in Table 1 for each of four possible scenarios denoted A through D. The LUT may be implemented in any suitable memory device, e.g., ROM, RAM, etc. The input to the LUT comprises the two bits of rising clock phase and two bits of falling clock phase.

TABLE 1

Correction Circuit LUT Contents

| | Clock Phase (Rising) | | Clock Phase (Falling) | | |
|---|---|---|---|---|---|
| Scenario | Rising | Falling | Rising | Falling | Output |
| A | 0 | 1 | 0 | 1 | 0 |
| B | 1 | 0 | 1 | 0 | 0 |
| C | 0 | 1 | 1 | 0 | +1 |
| D | 1 | 0 | 0 | 1 | −1 |

A rising bit equal to '1' indicates that the rising (or falling) edge of the data was detected closer to the rising edge of the fast clock. Similarly, a falling bit equal to '1' indicates that the rising (or falling) edge of the data was detected closer to the falling edge of the fast clock. Nothing is added to the count value in the two cases where the rising and falling edges of the data occur in the same half cycle of the fast clock. A value of +1 is added to the count when the rising edge of the data occurs closer to the falling edge of the fast clock and the falling edge of the data occurs closer to the rising edge of the fast clock. A value of −1 is added to the count when the rising edge of the data occurs closer to the rising edge of the fast clock and the falling edge of the data occurs closer to the falling edge of the fast clock. Note that other compensation or correction schemes are possible and the above table contents are provided only as an example.

Examples of each of the four possible scenarios A through D for the rising and falling transitions of the input data signal are presented below. A first timing diagram illustrating the operation of the event duration measurement circuit of the present invention is shown in FIG. 7. This timing example corresponds to scenario A in the Table 1 above. The rising edge of the input data signal is detected by the falling edge of the fast clock within the rising edge metastability resolver while the falling edge of the data signal is detected by the falling edge of the fast clock within the falling edge metastability resolver. In this case, no correction is added to the count value. Since for all possible count values of 5, 6 and 7 (measured in terms of half fast cycles), the count value is 3 which results in an output of 6, the average of 5, 6 and 7.

Figure 8:
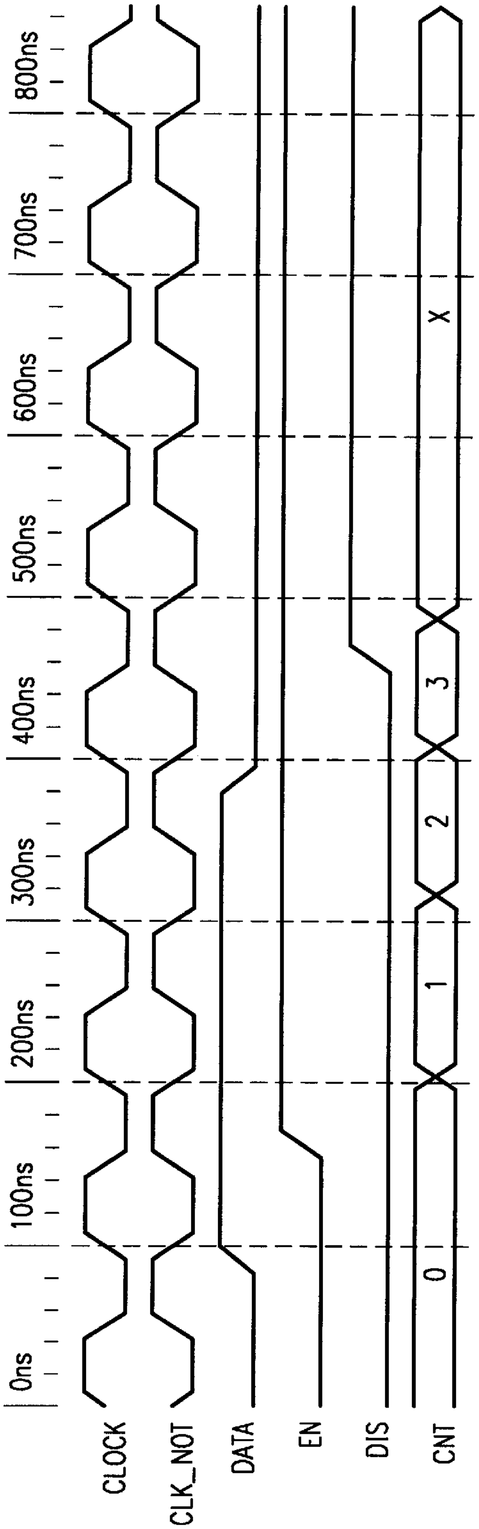
FIG. 8 is a second timing diagram illustrating the operation of the event duration measurement circuit of the present invention.

A second timing diagram illustrating the operation of the event duration measurement circuit of the present invention is shown in FIG. 8. This timing example corresponds to scenario B in Table 1 above. The rising edge of the input data signal is detected by the rising edge of the fast clock within the rising edge metastability resolver, while the falling edge of the data signal is detected by the rising edge of the fast clock within the falling edge metastability resolver. Here too, no correction is added to the count value, since for all possible count values of 5, 6 and 7, the counter output is 3 which results in an output of 6, the average of 5, 6 and 7 after the LSB is added to the counter output result.

Figure 9:
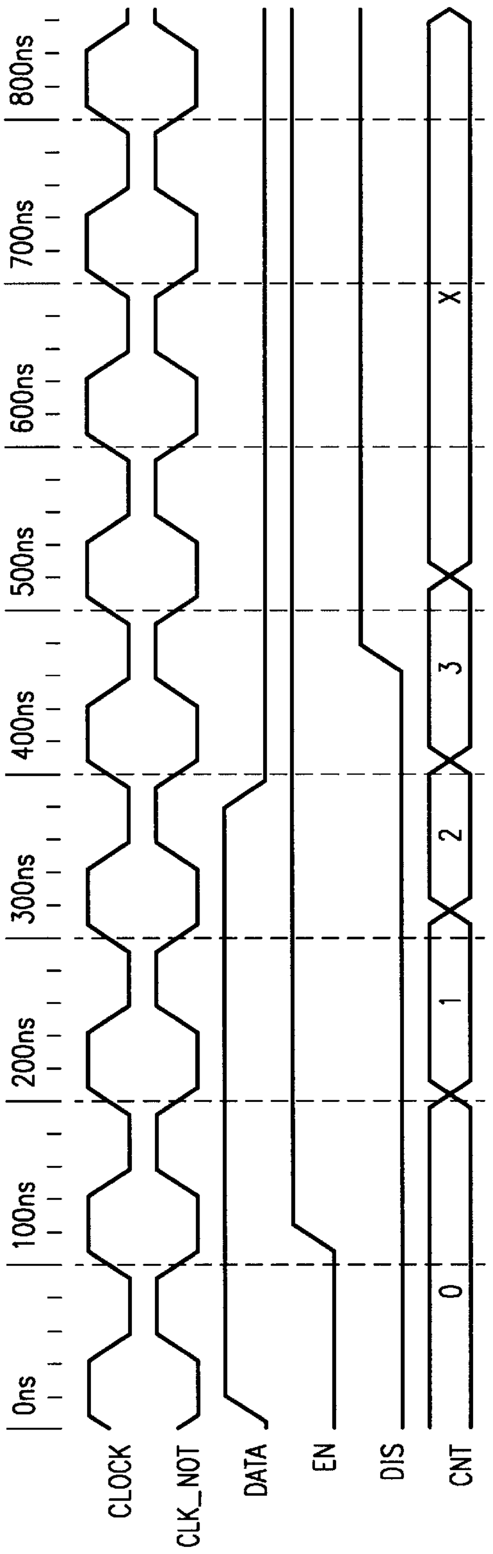
FIG. 9 is a third timing diagram illustrating the operation of the event duration measurement circuit of the present invention.

A third timing diagram illustrating the operation of the event duration measurement circuit of the present invention is shown in FIG. 9. This timing example corresponds to scenario C in Table 1 above. The rising edge of the input data signal is detected by the falling edge of the fast clock within the rising edge metastability resolver, while the falling edge of the data signal is detected by the rising edge of the fast clock within the falling edge metastability resolver. In this case, a correction factor of +1 is added to the counter output since for all possible count values of 6, 7 and 8, the counter output is 3, which would result in an output of 6 after the LSB is added to the count output. The desired value, however, is the average value 7, therefore a value of +1 is added to the counter output.

Figure 10:
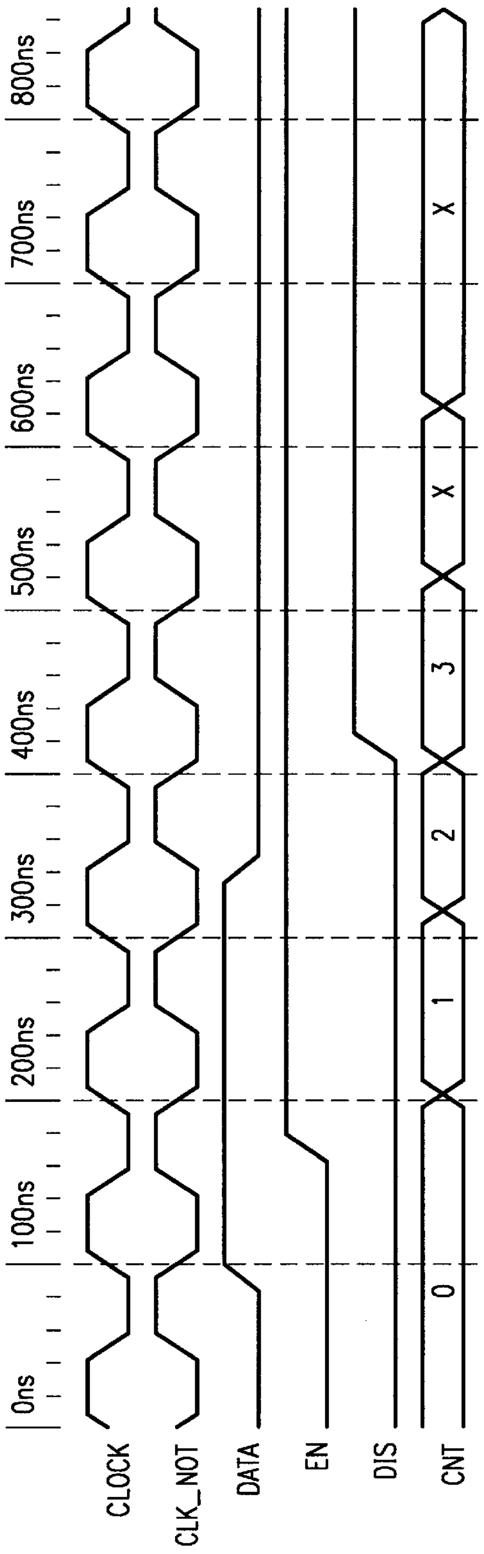
FIG. 10 is a fourth timing diagram illustrating the operation of the event duration measurement circuit of the present invention.

A fourth timing diagram illustrating the operation of the event duration measurement circuit of the present invention is shown in FIG. 10. This timing example corresponds to scenario D in Table 1 above. The rising edge of the input data signal is detected by the rising edge of the fast clock within the rising edge metastability resolver, while the falling edge of the data signal is detected by the falling edge of the fast clock within the falling edge metastability resolver. In this case, a correction factor of −1 is added to the counter output since for all possible count values of 4, 5 and 6, the counter output is 3, which results in an output of 6 after the LSB is added to the count output. The desired value, however, is the average value 5, therefore a value of −1 is added to the counter output.

Figure 1:
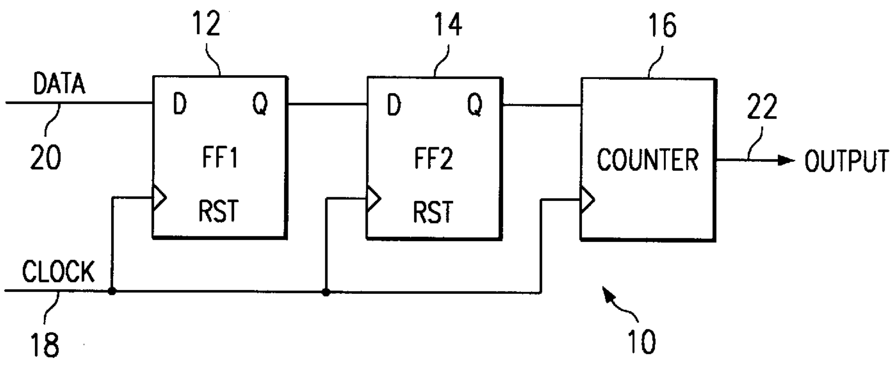
FIG. 1 (PRIOR ART)
FIG. 1 is a schematic diagram illustrating a prior art circuit for measuring the time of asynchronous events.
Figure 4:
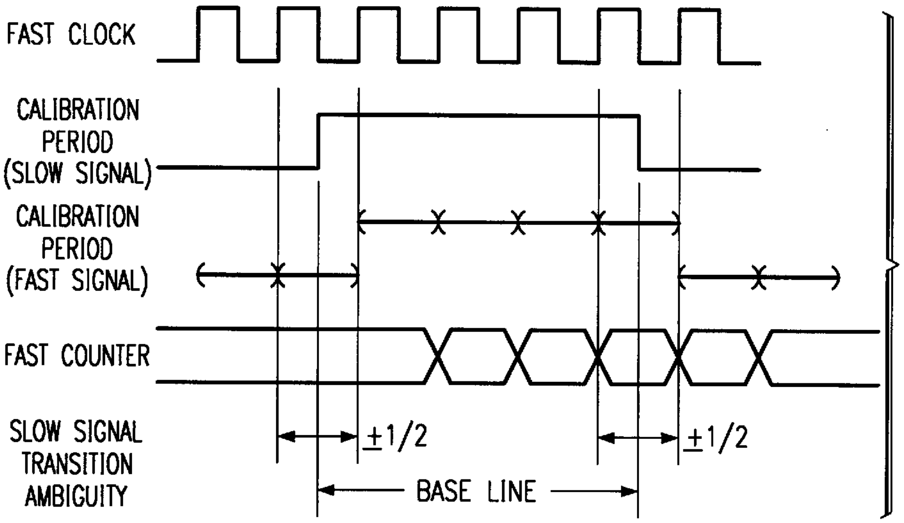
FIG. 4 (PRIOR ART)
FIG. 4 is a third timing diagram illustrating the inaccuracies of the prior art circuit of FIG. 1.
Figure 11:
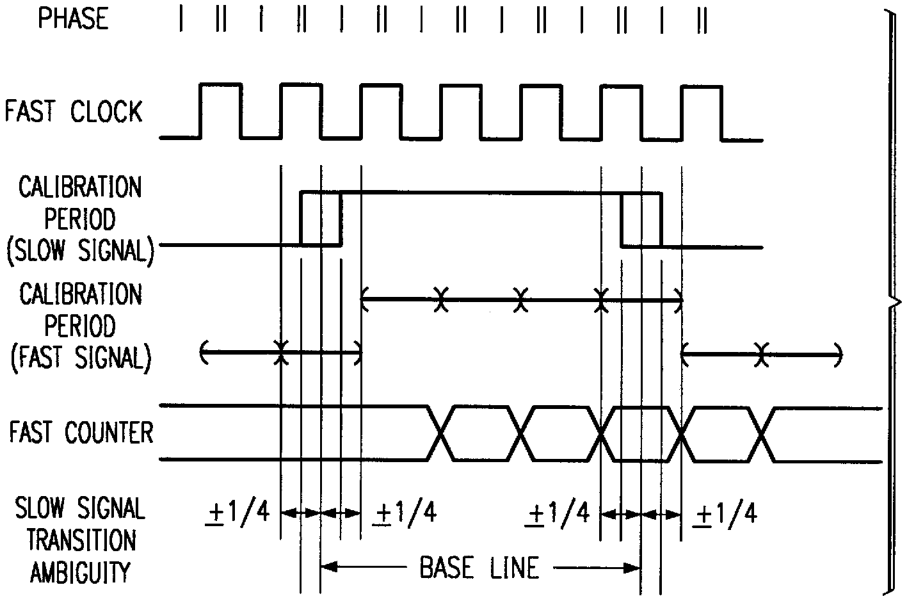
FIG. 11 is a timing diagram illustrating the accuracy of the event duration measurement circuit of the present invention.
Figure 2:
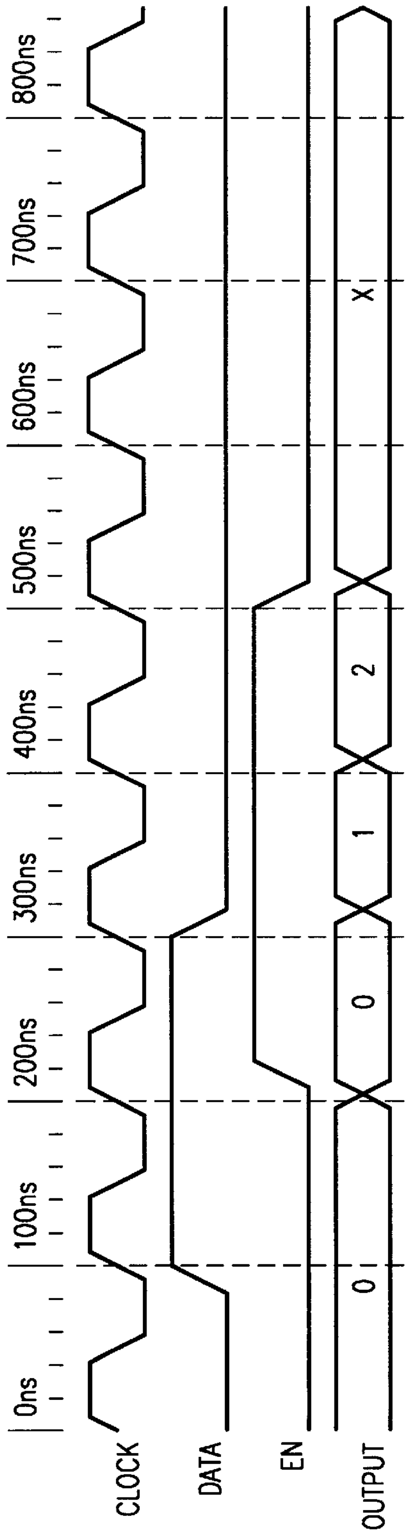
FIG. 2 (PRIOR ART)
FIG. 2 is a first timing diagram illustrating the inaccuracies of the prior art circuit of FIG. 1.
Figure 3:
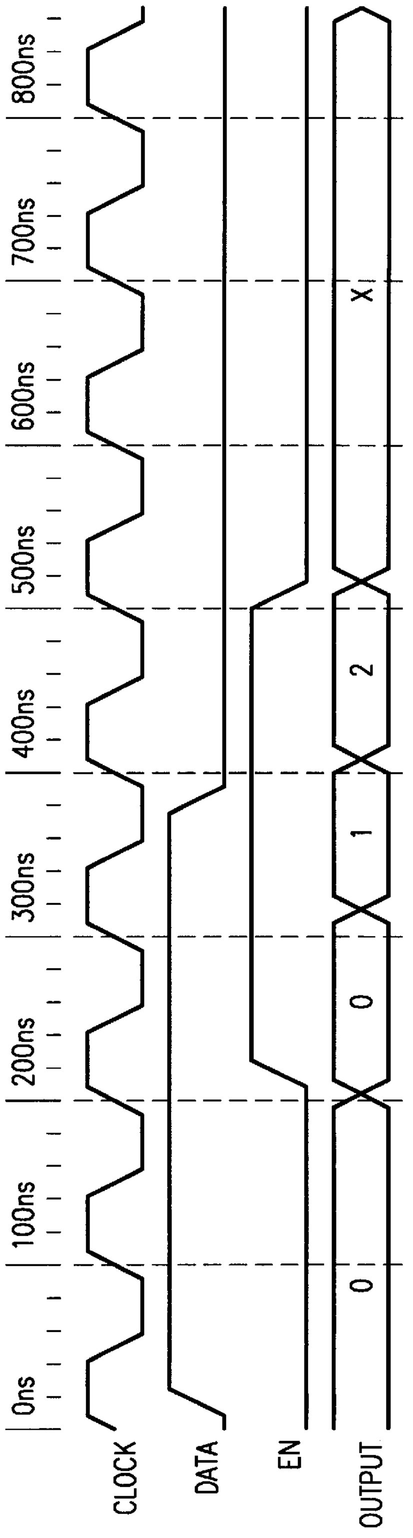
FIG. 3 (PRIOR ART)
FIG. 3 is a second timing diagram illustrating the inaccuracies of the prior art circuit of FIG. 1.

It is noted that the use of both fast clock edges in conjunction with the 'fast clock phase' indication in detecting the rising and falling edges of the input data signal in accordance with the present invention, provides additional information which reduces the timing ambiguity by a factor of two, by introducing a bias correction indicated by the fast clock phase signals. A timing diagram illustrating the accuracy of the event duration measurement circuit of the present invention is shown in FIG. 11. The first half of the fast clock cycle is indicated by the Phase I indications while the second half of the fast clock cycle is indicated by the Phase II indications. The calibration signal (i.e. data signal) is shown along with its representation in fast clock cycles below it. The resultant counter output is also shown.

The overall error and ambiguity of the calibration period measurement as generated by the present invention are provided in Table 2 below.

TABLE 2

| Incurred Error and Ambiguity | | |
|---|---|---|
| | Period Start-Phase I (+ ¼ ± ¼) | Period Start-Phase II (− ¼ ± ¼) |
| Period End-Phase I (− ¼ ± ¼) | 0 ± ½ (B) | −½ ± ½ (C) |
| Period End-Phase II (+ ¼ ± ¼) | +½ ± ½ (D) | 0 ± ½ (A) |

Note that the scenario corresponding to each possibility is indicated next to the ambiguity for that entry.

Combinatorial logic, look up table or other suitable circuitry, functions to decode the fast clock phase indication signals generated by the rising edge and falling edge metastability resolvers. Based on the correction factor or bias generated, the fast clock residue is incremented or decremented by +½ or −½ LSB. This is done by incrementing or decrementing the fast clock counter as required after the counter output is extended with an additional one LSB that is initialized with a value of '0'.

The overall measurement resolution achieved is thus ±½ fast clock cycle and the total resultant ambiguity is ±¼(or one ½) fast clock cycle. The improved timing accuracy achieved through the use of the mechanism of the present invention enables the doubling of the maximal standby time allowed for a device. A direct implication of this is extended battery lifetime in battery-operated devices.

In alternative embodiments, the present invention may be applicable to implementations of the invention in integrated circuits, field programmable gate arrays (FPGAs), chip sets or application specific integrated circuits (ASICs), wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. An apparatus for measuring the time duration between asynchronous events using a first clock, comprising:

means for generating a first edge event signal and an associated first clock phase signal, said first edge event signal corresponding to the detection of a rising edge of an input data signal, said first clock phase signal adapted to indicate whether said rising edge of said data signal occurred in a first or second half cycle of said first clock;

means for generating a second edge event signal and an associated second clock phase signal, said second edge event signal corresponding to the detection of a falling edge of said data signal, said second clock phase signal adapted to indicate whether said falling edge of said data signal occurred in a first or second half cycle of said first clock;

a counter adapted to generate an N bit output wherein counting is enabled in response to said first edge event signal and wherein counting is disabled in response to said second edge event signal; and means for compensating said N-bit counter output in accordance with said first clock phase signal and said second clock phase signal so as to generate an N+1 bit output representing said time duration.

2. The apparatus according to claim 1, wherein said means for generating a first edge event signal comprises a metastability resolver clocked by said first clock and adapted to detect the rising edge of said data signal.

3. The apparatus according to claim 1, wherein said means for generating a first edge event signal comprises two branches of cascaded flip flops, wherein each branch comprises one or more flip flops adapted to sample on the rising edge of said first clock and one or more flip flops adapted to sample on the falling edge of said first clock.

4. The apparatus according to claim 1, wherein said means for generating a first edge event signal is adapted to detect the rising edge of said data signal with an accuracy of one half cycle of said first clock.

5. The apparatus according to claim 1, wherein said means for generating a second edge event signal comprises a metastability resolver clocked by an inverted version of said first clock and adapted to detect the falling edge of said data signal.

6. The apparatus according to claim 1, wherein said means for generating a second edge event signal comprises two branches of cascaded flip flops, wherein each branch comprises one or more flip flops adapted to sample on the rising edge of said first clock and one or more flip flops adapted to sample on the falling edge of said first clock.

7. The apparatus according to claim 1, wherein said means for generating a second edge event signal is adapted to detect the falling edge of said data signal with an accuracy of one half cycle of said first clock.

8. The apparatus according to claim 1, wherein said means for compensating comprises:

a look up table adapted to generate a correction factor in accordance with said first clock phase signal and said second clock phase signal;

means for adding a least significant bit to said counter output to generate an N+1 output; and an adder adapted to generate the sum of said correction factor and said N+1 output to yield said time duration.

9. The apparatus according to claim 1, wherein said time between asynchronous events represents a whole period or a portion thereof of a second clock wherein the frequency of said second clock is lower than that of said first clock.

10. The apparatus according to claim 1, wherein said counter is adapted to be clocked off said first clock.

11. A method of measuring the time duration between asynchronous events, said method comprising the steps of:

generating a first edge event signal and an associated first clock phase signal, said first edge event signal adapted to indicate a first transition of an input data signal from a low to high state, said first clock phase signal adapted to indicate whether said first transition of said data signal occurred in a first or second half cycle of a first clock signal;

generating a second edge event signal and an associated second clock phase signal, said second edge event signal adapted to indicate a second transition of said input data signal from a high to low state, said second clock phase signal adapted to indicate whether said second transition of said data signal occurred in a first or second half cycle of a first clock signal;

enabling an N-bit counter in response to said first edge event signal;

disabling said counter in response to said second edge event signal; and compensating said N-bit counter output in accordance with said first clock phase signal and said second clock phase signal so as to generate an N+1 bit output representing said time duration.

12. The method according to claim 11, wherein said first edge event signal is generated with an accuracy of one half cycle of said first clock.

13. The method according to claim 11, wherein said second edge event signal is generated with an accuracy of one half cycle of said first clock.

14. The method according to claim 11, wherein said step of compensating comprises the steps of:

generating a correction factor in accordance with said first clock phase signal and said second clock phase signal;

adding a least significant bit to said counter output to generate an N+1 output; and generating the sum of said correction factor and said N+1 output to yield said time duration.

15. The method according to claim 11, wherein said time between asynchronous events represents a whole period or a portion thereof of a second clock wherein the frequency of said second clock is lower than that of said first clock.

16. An apparatus for measuring the relative timing drift between a first clock and a slower second clock, comprising:

means for generating a first edge event signal and an associated first clock phase signal, said first edge event signal adapted to indicate a first transition of said second clock from a low to high state, said first clock phase signal adapted to indicate whether said first transition of said second clock occurred in a first or second half cycle of said first clock;

means for generating a second edge event signal and an associated second clock phase signal, said second edge event signal adapted to indicate a second transition of said second clock from a high to low state, said second clock phase signal adapted to indicate whether said second transition of said second clock occurred in a first or second half cycle of said first clock;

a counter adapted to generate an N bit output wherein counting is enabled in response to said first edge event signal and wherein counting is disabled in response to said second edge event signal; and means for correcting said N-bit counter output in accordance with said first clock phase signal and said second clock phase signal so as to generate an N+1 bit output representing said time duration.

17. The apparatus according to claim 16, wherein said means for generating a first edge event signal comprises a metastability resolver clocked by said first clock and adapted to detect the rising edge of said second clock.

18. The apparatus according to claim 16, wherein said means for generating a second edge event signal comprises a metastability resolver clocked by an inverted version of said first clock and adapted to detect the falling edge of said second clock.

19. The apparatus according to claim 16, wherein said means for correcting comprises:

a look up table adapted to generate a correction factor in accordance with said first clock phase signal and said second clock phase signal;

means for adding a least significant bit to said counter output to generate an N+1 output; and an adder adapted to generate the sum of said correction factor and said N+1 output to yield said time duration.

20. The apparatus according to claim 16, wherein said counter is adapted to be clocked off said first clock.

21. An apparatus for measuring the relative timing drift between a first clock and a slower second clock, comprising:

a first metastability resolver clocked by said first clock for generating a first edge event signal and an associated first clock phase signal, said first edge event signal corresponding to the detection of a rising edge of said second clock, said first clock phase signal adapted to indicate whether said rising edge of said second clock occurred in a first or second half cycle of said first clock;

a second metastability resolver clocked by an inverted first clock for generating a second edge event signal and an associated second clock phase signal, said second edge event signal corresponding to the detection of a falling edge of said second clock, said second clock phase signal adapted to indicate whether said falling edge of said second clock occurred in a first or second half cycle of said first clock;

a counter adapted to generate an N-bit output wherein counting is enabled in response to said first edge event signal and wherein counting is disabled in response to said second edge event signal;

a correction circuit adapted to generate a correction factor in accordance with said first clock phase signal and said second clock phase signal; and an adder adapted to add a least significant bit to said counter output to yield an N+1 bit value and to generate the sum of said correction factor and said N+1 bit value to yield said relative timing drift between said first clock and said second clock.

22. The apparatus according to claim 21, wherein said first metastability resolver comprises two branches of cascaded flip flops, wherein each branch comprises one or more flip flops adapted to sample on the rising edge of said first clock and one or more flip flops adapted to sample on the falling edge of said first clock.

23. The apparatus according to claim 21, wherein said second metastability resolver comprises two branches of cascaded flip flops, wherein each branch comprises one or more flip flops adapted to sample on the rising edge of said first clock and one or more flip flops adapted to sample on the falling edge of said first clock.

24. The apparatus according to claim 21, wherein said first metastability resolver is adapted to detect the rising edge of said second clock with an accuracy of one half cycle of said first clock.

25. The apparatus according to claim 21, wherein said second metastability resolver is adapted to detect the falling edge of said second clock with an accuracy of one half cycle of said first clock.

26. The apparatus according to claim 21, wherein said correction circuit comprises a look up table adapted to generate said correction factor in accordance with said first clock phase signal and said second clock phase signal.

* * * * *